(12) United States Patent
Masip

(10) Patent No.: US 10,286,788 B2
(45) Date of Patent: May 14, 2019

(54) ON BOARD CHARGER FOR ELECTRIC VEHICLES

(71) Applicant: Fico Triad, S.A., Barcelona (ES)

(72) Inventor: Guillem Rovira Masip, Barcelona (ES)

(73) Assignee: FICO TRIAD, S.A., Barcelona (ES)

(*) Notice: Subject to any disclaimer, the term of this patent is extended or adjusted under 35 U.S.C. 154(b) by 29 days.

(21) Appl. No.: 15/384,926

(22) Filed: Dec. 20, 2016

(65) Prior Publication Data
US 2017/0182896 A1    Jun. 29, 2017

(30) Foreign Application Priority Data

Dec. 24, 2015   (EP) .................................... 15382662

(51) Int. Cl.
| | |
|---|---|
| *H02J 7/00* | (2006.01) |
| *B60L 11/18* | (2006.01) |
| *H02J 7/02* | (2016.01) |
| *H05K 7/14* | (2006.01) |
| *H05K 7/20* | (2006.01) |
| *H02M 1/00* | (2006.01) |

(52) U.S. Cl.
CPC ......... *B60L 11/1812* (2013.01); *H02J 7/0042* (2013.01); *H02J 7/022* (2013.01); *H05K 7/1432* (2013.01); *H05K 7/20927* (2013.01); *H02M 2001/0064* (2013.01)

(58) Field of Classification Search
CPC ..... B60L 11/1812; H02J 7/0042; H02J 7/022; H05K 7/1432; H05K 7/2097
USPC ........................................................ 320/109
See application file for complete search history.

(56) References Cited

U.S. PATENT DOCUMENTS

| 4,601,051 A | * | 7/1986 | Santurtun | ................ H05G 1/54 378/105 |
| 4,751,398 A | * | 6/1988 | Ertz, III | .................. H02J 9/065 307/44 |
| 5,198,743 A | * | 3/1993 | McClure | ............... H02J 7/0081 320/145 |

(Continued)

FOREIGN PATENT DOCUMENTS

WO       2013061799 A1      5/2013

OTHER PUBLICATIONS

EP Search Report; International Aplication No. EP3185406A1; International Filing Date: Dec. 24, 2015; 2 pages.

*Primary Examiner* — M Baye Diao
(74) *Attorney, Agent, or Firm* — Cantor Colburn LLP

(57) ABSTRACT

On board charger for electric vehicles having an AC input and a DC power output and comprising a housing that contains a power electronic circuit, a control electronic circuit, capacitors, inverters, at least one transformer, input inductor and output inductor inside to allow the conversion of input AC power into output DC power, the base of the housing incorporating a cooling circuit, such that the at least one transformer, the at least one input inductor and the at least one output inductor are arranged in a compartment delimited by several side walls and the base of the housing of the on board charger and at least one internal wall, the compartment being at least partially filled with potting which at least partially covers the at least one transformer, the at least one input inductor and the at least one output inductor, these three elements constituting one magnetic block.

7 Claims, 6 Drawing Sheets

(56) References Cited

U.S. PATENT DOCUMENTS

| | | | |
|---|---|---|---|
| 7,659,678 B2* | 2/2010 | Maiocchi | H02M 3/156 |
| | | | 318/400.22 |
| 8,027,179 B2* | 9/2011 | Hallak | H02M 7/4807 |
| | | | 363/127 |
| 8,299,754 B2* | 10/2012 | Hayashigawa | B60L 3/0069 |
| | | | 320/104 |
| 9,878,624 B2* | 1/2018 | Kim | B60L 11/1814 |
| 2012/0146525 A1* | 6/2012 | Hui | H05B 33/0809 |
| | | | 315/200 R |
| 2013/0235527 A1 | 9/2013 | Wagner et al. | |
| 2015/0048675 A1 | 2/2015 | Fujii et al. | |
| 2015/0175020 A1* | 6/2015 | Kim | B60L 3/003 |
| | | | 320/109 |
| 2016/0023560 A1* | 1/2016 | Yim | B60L 11/1809 |
| | | | 320/109 |
| 2016/0121741 A1* | 5/2016 | Kim | B60L 11/1814 |
| | | | 318/139 |

* cited by examiner

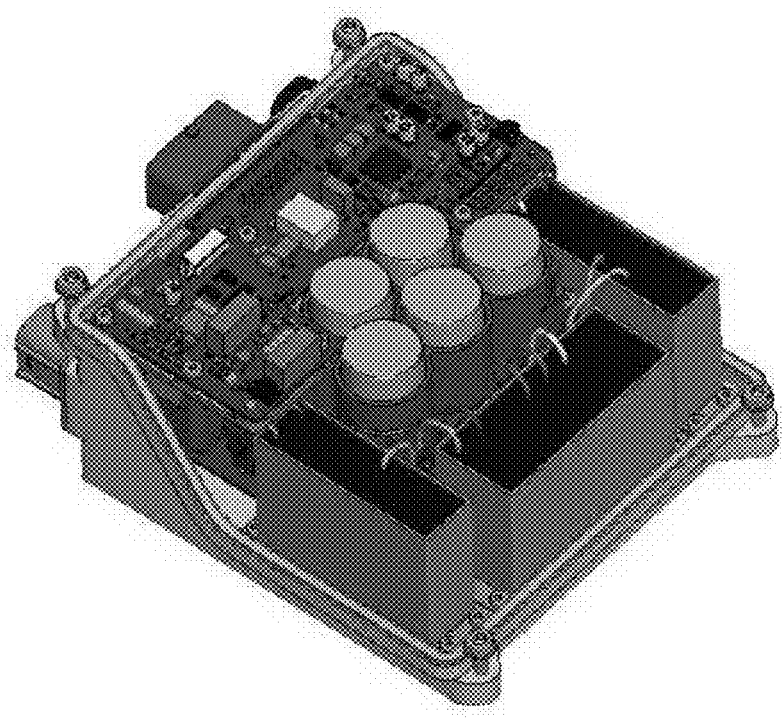
FIG. 1 – PRIOR ART
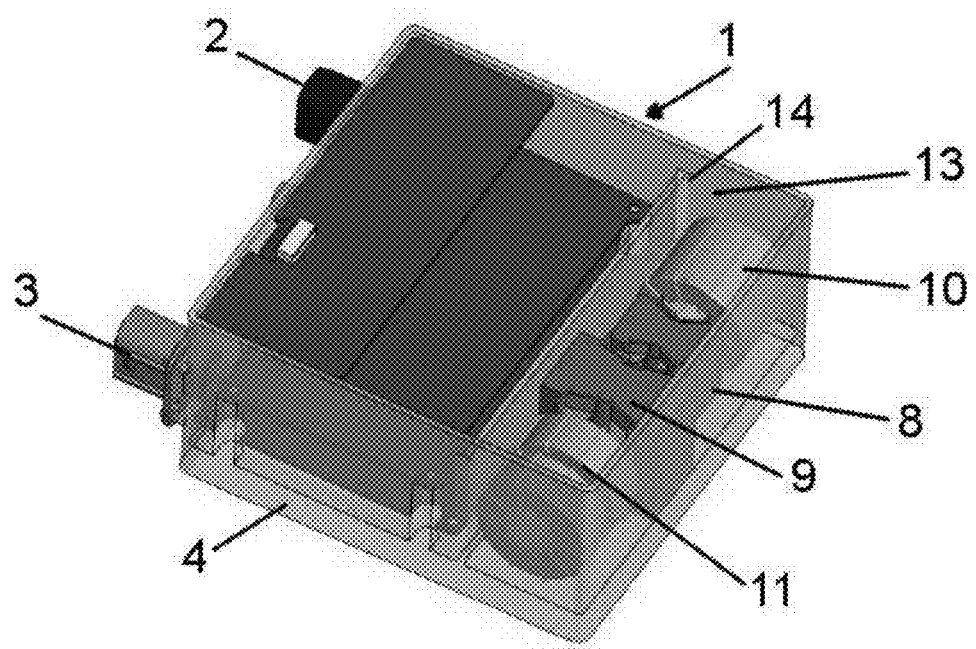
FIG. 2

ON BOARD CHARGER FOR ELECTRIC VEHICLES

CROSS-REFERENCE TO RELATED APPLICATIONS

This patent application claims priority to European Patent Application No. EP15382662.3 filed Dec. 24, 2015, which is incorporated herein by reference in its entirety.

BACKGROUND OF THE INVENTION

The present invention relates to an On Board Charger (OBC), belonging to the type of chargers for electric vehicle batteries that convert AC power into DC power to recharge them.

On Board chargers are power converters that usually comprise several blocks and stages:

Input: includes the power conversion from AC input to DC intermediate capacitor tank and may need some inductors.

Capacitor tank: is used for filtering and for intermediate energy storage.

Inverter: is a power electronic block that uses the energy stored in the capacitor tank and converts it into AC power, delivered to a transformer.

Transformer: is a magnetic part, used for the isolation and for the adaptation of voltages/currents, between the Input side and the Output side.

Output: includes the power conversion from the transformer AC output, into a DC power output, delivered to the battery to be charged. For this power conversion some inductors are necessary in order to filter to output current.

Power PCB: electronic circuit used for the regulation of the power conversion in all the stages. Includes the power regulation implementation and the sensors for voltages and currents.

Control PCB: electronic circuit that controls the functions of the On Board Charger. This Control PCB communicates with the Power PCB in order to set the values of the desired charging parameters. The control PCB also receives information about the real values from the power PCB. The Control PCB is also linked to the vehicle for communication.

The magnetic parts (input inductors, transformer, output inductors) are usually installed inside an On Board charger in three separate magnetic blocks. Each of these blocks is usually composed of one or two elements made of copper wire winding around a ferrite core, lodged inside an aluminium housing and covered by potting to fix parts inside the housing, and act as a dielectric barrier. Each of these blocks is assembled inside the OBC housing (which is also made of aluminium) by means of screws.

This arrangement of the magnetic parts of the OBC has several disadvantages from the point of view of fixation and takes much space. The mechanical fixation by means of screws makes the OBC more sensitive to damages due to vibrations and shocks, which are transmitted to the base of the housing of the OBC.

SUMMARY OF THE INVENTION

Therefore, the object of the invention is to provide an On Board charger in which the magnetic parts (input inductors, transformer, output inductors) have a more compact arrangement inside the OBC and an improved fixation to the housing of the OBC at the same time.

The invention provides an on board charger for electric vehicles, the on board charger having an AC input and a DC power output and comprising a housing that contains a power electronic circuit, a control electronic circuit, capacitors, inverters, at least one transformer, at least one input inductor and at least one output inductor inside to allow the conversion of input AC power into output DC power, the base of the housing incorporating a cooling circuit, such that the at least one transformer, the at least one input inductor and the at least one output inductor are arranged in a compartment delimited by several side walls and the base of the housing of the on board charger and at least one internal wall, the compartment being at least partially filled with potting which at least partially covers the at least one transformer, the at least one input inductor and the at least one output inductor, these three elements constituting one magnetic block.

In effect, with this configuration the potting that covers the magnetic parts is firmly fixed to the walls of the housing of the OBC, which provides robustness to the arrangement of the magnetic parts and in a simple manner.

Another advantage of the invention is that it allows the reduction of the external dimensions of the OBC, due to the fact that no individual fixation is needed for each magnetic part.

An additional advantage of the invention is that the magnetic block provides EMC shielding, due to the fact that the magnetic block is surrounded by the walls of the housing, preferably made of aluminium.

Besides that, the arrangement of the invention allows a better distribution of heat flow (avoiding hot points), and the contact between the magnetic block comprising all the magnetic parts and the housing of the OBC (which acts as a heat sink) is highly increased to improve heat dissipation. This allows the implementation of a simpler cooling circuit on the base of the housing of the OBC with lower pressure drop, which is very important, as the coolant comes from the general cooling circuit of the vehicle.

Other advantageous embodiments will be described in the dependent claims.

BRIEF DESCRIPTION OF THE DRAWINGS

For a more complete understanding of the present invention, it will be described below in greater detail, making reference to the attached drawings, in which:

FIG. 1 is a perspective view of an on board charger of the prior art without the cover, showing its internal components.

FIG. 2 is a perspective view of an on board charger of the invention without the cover.

DETAILED DESCRIPTION OF THE INVENTION

Figure 3:
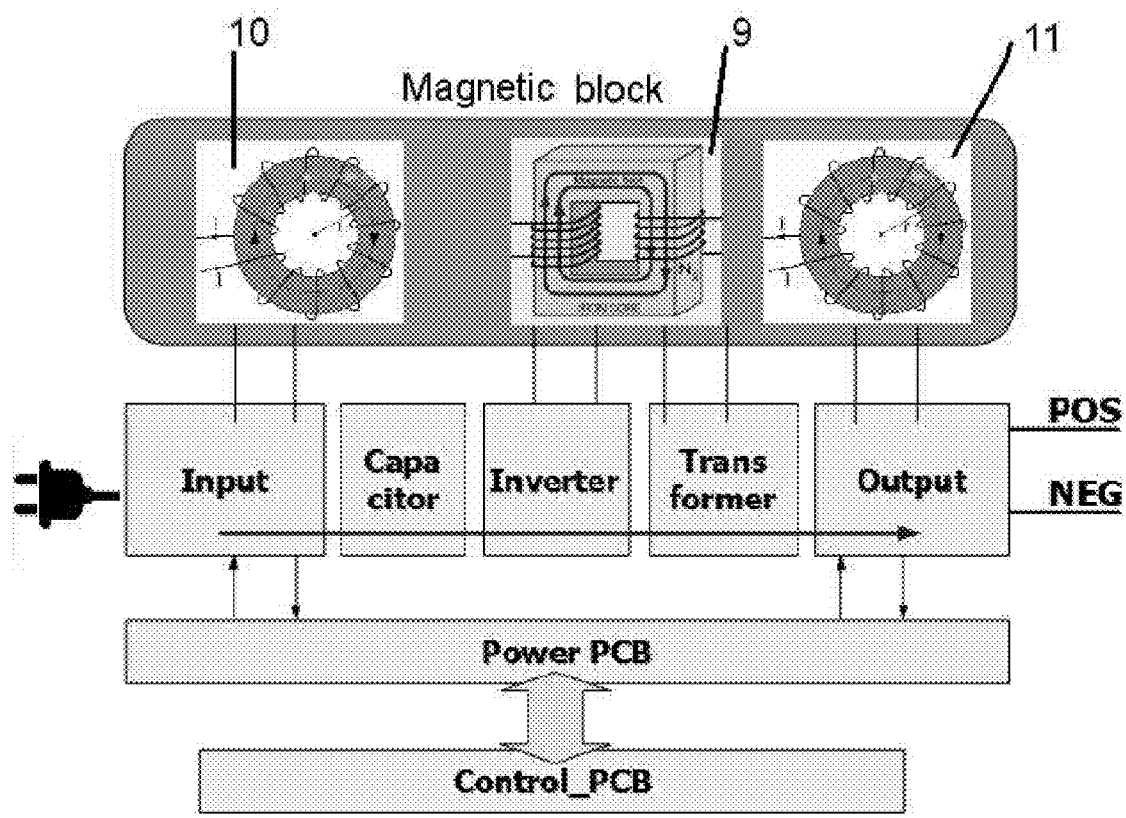
FIG. 3 is a schematic blocks diagram of the on board charger of the invention.

FIG. 1 corresponds to an on board charger (OBC) of the prior art without the cover, showing its internal components. In this figure the magnetic parts (input inductors, transformer, output inductors) are arranged inside the OBC in three separate magnetic blocks. Each of these blocks is composed of two elements made of copper wire winding around a ferrite core, lodged inside an aluminium housing and covered by potting to fix parts inside the housing, and act as a dielectric barrier. Each of these blocks is assembled inside the OBC housing (which is also made of aluminium) by means of screws.

FIG. 2 corresponds to an OBC 1 according to the invention, in which the cover 19 has been removed to see the internal components. In this figure it can be seen that a compartment 13 has been created inside the OBC 1 to place the input inductors 10, the transformer 9 and the output inductors 11 in a shared common volume, constituting a magnetic block 8. In the embodiment of FIG. 2, the compartment 13 is delimited by three side walls of the housing 4, the base of the housing 4 and one internal wall 14, that separates the magnetic parts from the other components placed inside the OBC 1.

FIG. 3 is a schematic blocks diagram of the OBC 1 of the invention, including an input, a capacitor, an inverter, a transformer, an output, a Power PCB a Control PCB and the magnetic block 8. The OBC 1 allows the conversion of input AC power into output DC power, as it is schematically shown in the blocks diagram.

Figure 4:
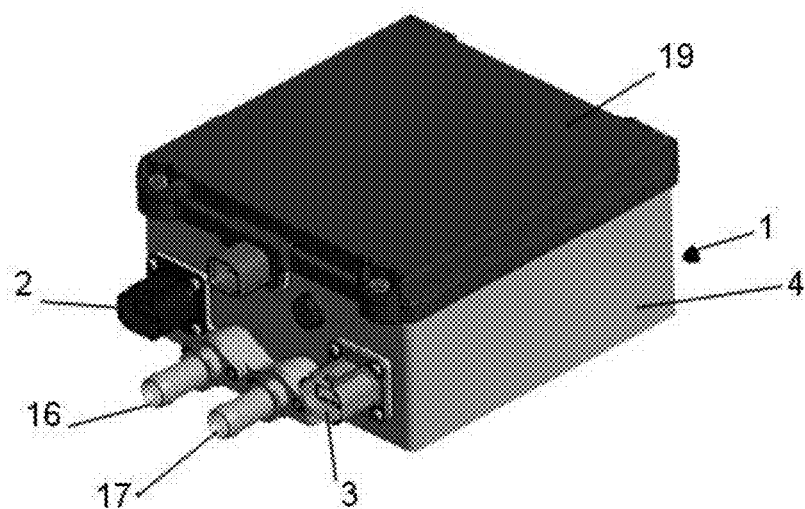
FIG. 4 is a perspective view of the housing of the on board charger of the invention with its cover.

FIG. 4 shows a general external view of the housing 4 of the OBC 1 of the invention with its cover 19 on. It also shows the connectors on its front side (AC input 2, DC output 3, inlet connector 16, outlet connector 17).

Figure 5:
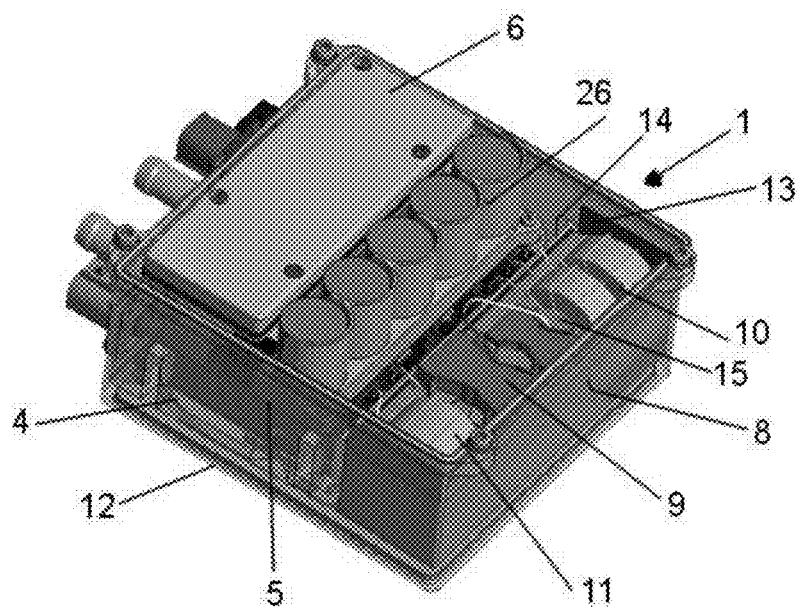
FIG. 5 is a perspective view showing the internal construction of the on board charger of the invention.
Figure 6:
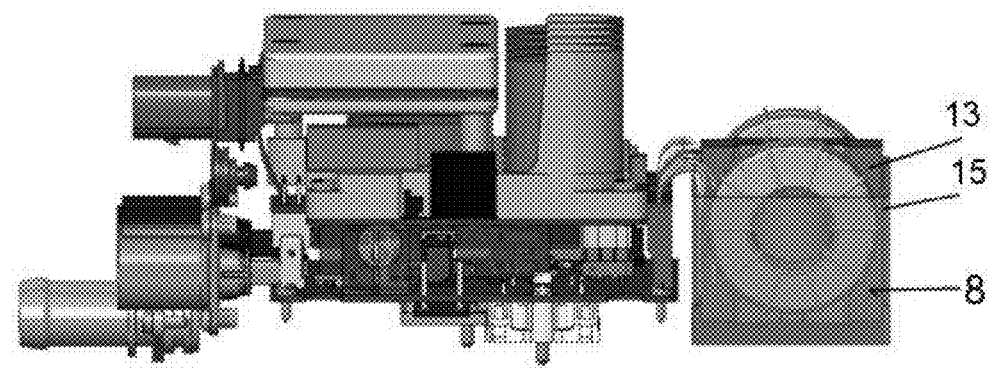
FIG. 6 is a side view showing the internal construction of the on board charger of the invention, without the housing.
Figure 7:
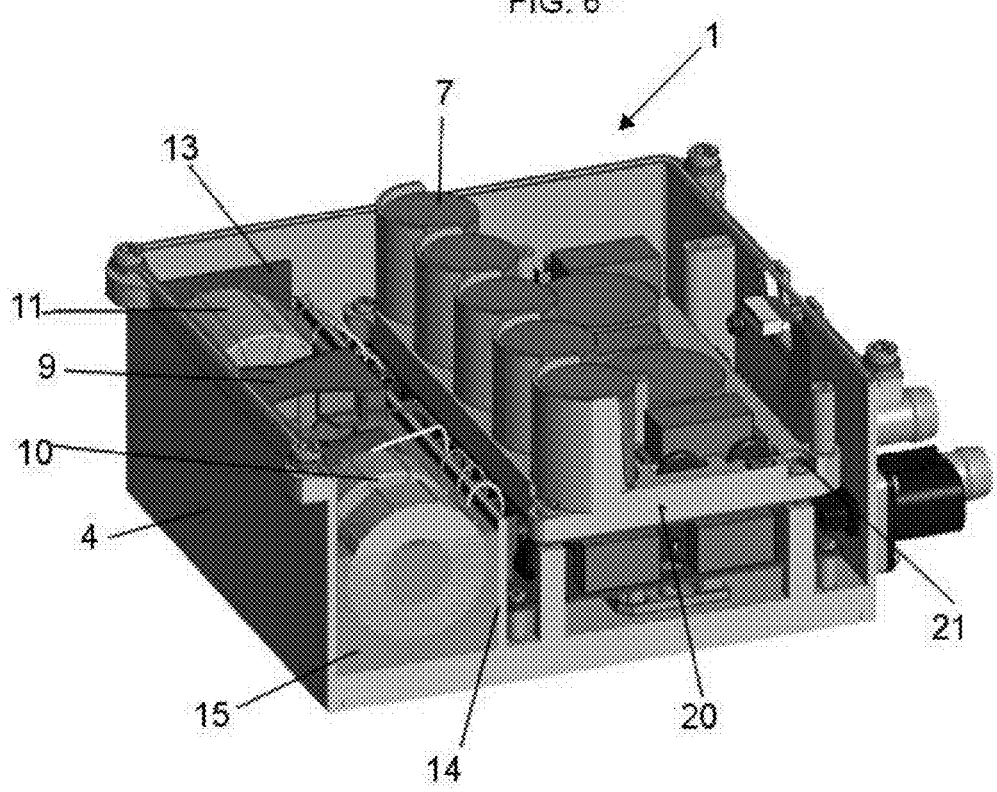
FIG. 7 is a perspective view showing the internal construction of the on board charger of the invention, without a side wall of the housing.

FIGS. 5 to 7 are different views of the components of the OBC 1, which also show its internal construction. In these figures it can be seen that the compartment 13 that contains the transformer 9, the input inductors 10 and the output inductors 11 is partially filled with potting 15 which partially covers the transformer 9, the input inductors 10 and the output inductors 11, these three elements constituting one magnetic block 8. As some magnetic parts are delicate, it is convenient not to cover them completely with potting 15.

Preferably the potting 15 fills at least three quarters of the height of the compartment 13, as it can be seen in FIG. 6.

The fixation of the magnetic parts (input inductors 10, transformer 9, output inductors 11) to the housing 4 is more robust, since the magnetic block 8 is fixed directly to the housing 4 of the OBC 1 by means of potting 15, as can be seen in these figures, in this way eliminating the screws.

In FIG. 7 it can be seen the fixation and mounting concept for the OBC 1 of the invention. To avoid vibration damage the magnetic block 8 is fixed to the housing 4 by potting 15 and the capacitors 7 and ferrites are fixed by means of a bracket 20 and resin potting. The bracket 20 and a filter PCB 26 are directly fixed to the housing 4 and the fixing points are reinforced with metallic inserts 21 to provide robustness avoiding plastics cracks. To fix the box to the vehicle, four M6 blind holes can be implemented at the bottom surface according to customer needs.

Figure 8:
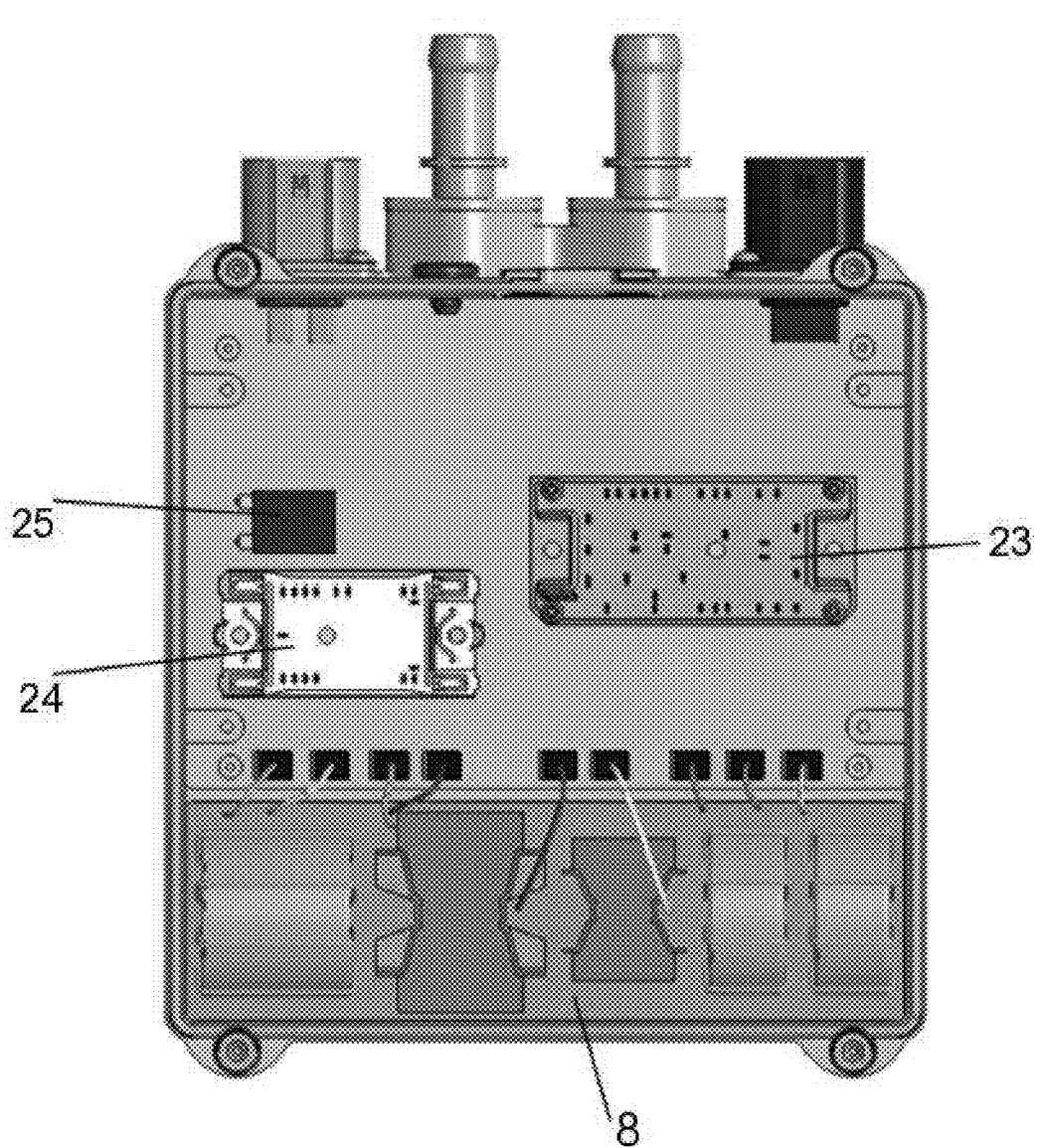
FIG. 8 is a plan view of the on board charger of the invention, showing the heat generating components.

FIG. 8 shows the distribution of the heat generating components, which is to be taken into account to design the cooling circuit. The main heat generating components are the Power modules (for example, first Power module 23: 150 W; second Power module 24: 140 W) and the magnetic block 8 (45,50 W). A snubber resistance 25 generates 5 W.

Figure 9:
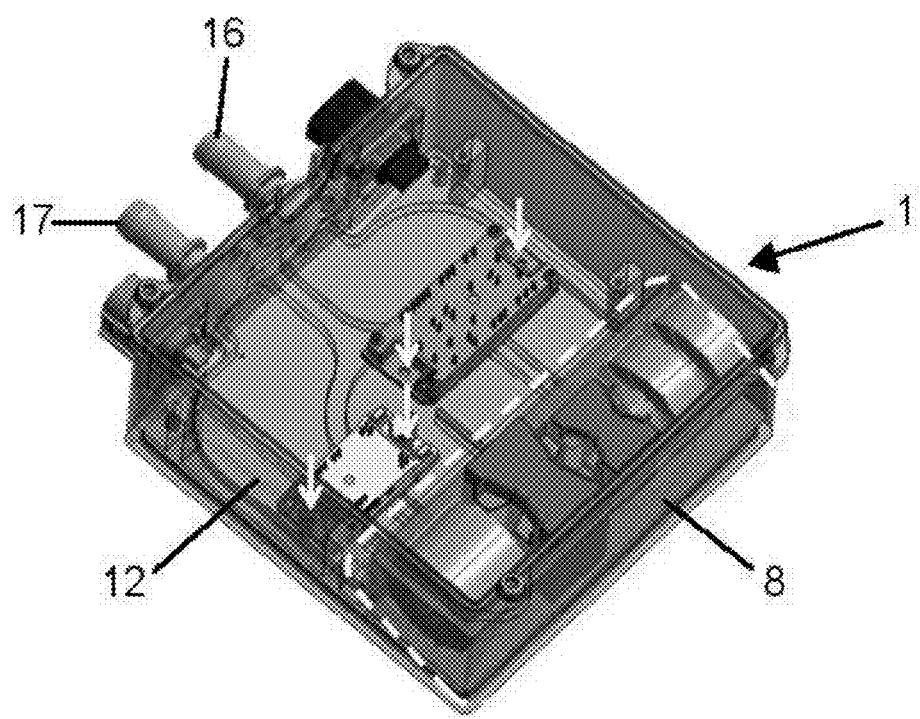
FIG. 9 is a perspective view of the on board charger of the invention, showing the cooling circuit and the contacts between heat generating components and the cooling plate.

FIG. 9 shows that all the heat generating components are directly fixed to the base of the housing 4 by screws (in the case of the power modules; see the arrows) or by potting 15 (in the case of the magnetic block 8; see the dotted lines).

Figure 10:
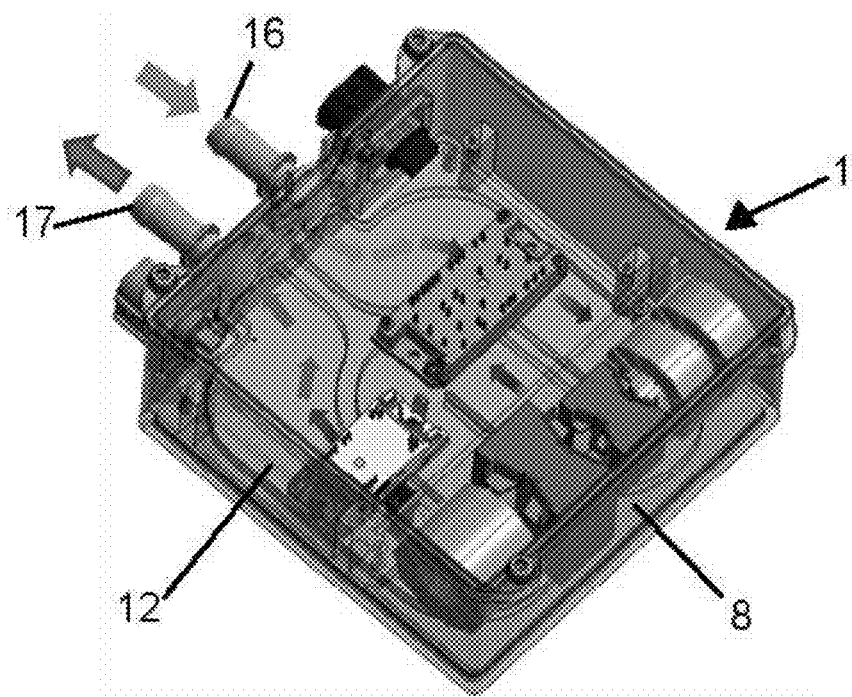
FIG. 10 is a perspective view of the on board charger of the invention, showing the cooling circuit and the flow of the coolant in the cooling circuit.

In FIGS. 9 and 10 it can be seen that the base of the housing 4 of the OBC 1 integrates the cooling circuit 12. The cooling circuit 12 of FIGS. 9 and 10 comprises a cold plate integrated in the housing of the OBC, an inlet and an outlet. The coolant enters through the inlet connector 16 and exits through the outlet connector 17. The cooling circuit 12 has several sections, which are arranged taking into account the distribution of the heat generating components to be able to dissipate the heat generated by these components.

Power semiconductors are directly fixed to the bottom of the housing 4 integrating the cold plate to allow good thermal contact for cooling.

Preferably, the coolant is a liquid. Although liquid cooling is preferred, other cooling systems (as air cooling, with natural or forced convection) can be used It is also possible to place several fins on the side external walls of the housing 4 of the OBC 1 to dissipate heat (not shown in the figures).

The housing 4 of the on board charger 1 including the cold plate of the cooling circuit 12 are preferably made of High Density Die Casting (HDDC) aluminium.

Although the present invention has been fully described in connection with preferred embodiments, it is evident that modifications may be introduced within the scope thereof, not considering this as limited by these embodiments, but by the contents of the following claims.

The invention claimed is:

1. On board charger for electric vehicles, the on board charger having an AC input and a DC power output and comprising a housing that contains a power electronic circuit, a control electronic circuit, capacitors, inverters, at least one transformer, at least one input inductor and at least one output inductor inside to allow the conversion of input AC power into output DC power, the base of the housing incorporating a cooling circuit, the at least one transformer, the at least one input inductor and the at least one output inductor are arranged in a shared common volume in a compartment delimited by several side walls and the base of the housing of the on board charger and at least one internal wall, such that the compartment is at least partially filled with potting which at least partially covers the at least one transformer, the at least one input inductor and the at least one output inductor, these three elements constituting one magnetic block.

2. On board charger for electric vehicles, according to claim 1, wherein the potting fills at least three quarters of the height of the compartment.

3. On board charger for electric vehicles, according to claim 1, wherein the cooling circuit comprises a cold plate integrated in the housing of the on board charger, an inlet and an outlet.

4. On board charger for electric vehicles, according to claim 1, wherein the cooling circuit includes a coolant that is a liquid.

5. On board charger for electric vehicles, according to claim 1, wherein the cooling circuit includes a coolant that is air.

6. On board charger for electric vehicles, according to claim 1, wherein the housing of the on board charger comprises several fins on its side external walls to dissipate heat.

7. On board charger for electric vehicles, according to claim 3, wherein the housing of the on board charger including the cold plate of the cooling circuit is made of High Density Die Casting aluminium.

* * * * *